United States Patent
Parida et al.

(10) Patent No.: US 8,159,381 B2
(45) Date of Patent: Apr. 17, 2012

(54) GLITCH FREE DYNAMIC ELEMENT MATCHING SCHEME

(75) Inventors: Rakhel Kumar Parida, Greater Noida (UP) (IN); Ankur Bal, Greater Noida (UP) (IN); Anil Kumar, Greater Noida (UP) (IN); Anupam Jain, Greater Noida (UP) (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 48 days.

(21) Appl. No.: 12/842,311

(22) Filed: Jul. 23, 2010

(65) Prior Publication Data

US 2011/0279292 A1    Nov. 17, 2011

(51) Int. Cl.
*H03M 1/66*    (2006.01)
(52) U.S. Cl. ........................... 341/144; 341/118
(58) Field of Classification Search ............... 341/118, 341/144
See application file for complete search history.

(56) References Cited

U.S. PATENT DOCUMENTS

| | | | |
|---|---|---|---|
| 6,462,691 B2 | | 10/2002 | Rudberg et al. |
| 6,522,277 B2 * | | 2/2003 | Fujimori et al. ............ 341/144 |
| 6,819,276 B1 * | | 11/2004 | Hossack ...................... 341/143 |
| 7,679,539 B2 * | | 3/2010 | Lee et al. .................... 341/144 |
| 7,719,455 B2 * | | 5/2010 | Kim et al. ................... 341/144 |
| 7,868,806 B2 * | | 1/2011 | Seo et al. .................... 341/144 |

OTHER PUBLICATIONS

Rudberg, M., et al., "Glitch Minimization and Dynamic Element Matching in D/A Converters", IEEE Xplore, 2000, pp. 899-902.
Vesterbacka, M., et al. "Dynamic Element Matching in D/A Converters with Restricted Scrambling", IEEE Xplore, pp. 36-39, © 2000.

* cited by examiner

*Primary Examiner* — Khai M Nguyen
(74) *Attorney, Agent, or Firm* — Hogan Lovells US LLP

(57) ABSTRACT

A dynamic element matching (DEM) scheme is implemented in a crawling code generator for converting a b-bit binary input code into a $(2^b-1)$-bit digital output code. A random generator determines for every conversion step a direction. A decimal difference between the current and previous binary input is calculated. The new crawling output code is determined based on the previous crawling output code, the direction and the decimal difference. The DEM scheme is used in a digital-to-analog converter such that the crawling output code switches digital-to-analog converting elements that output analog signals that are then summed to be the final analog signal.

19 Claims, 13 Drawing Sheets

←— counter-clockwise; clockwise —→

| input | bit positions | 1 | 2 | 3 | 4 | 5 | 6 | 7 | |
|---|---|---|---|---|---|---|---|---|---|
| 011 | | 0 | 1 | 1 | 1 | 0 | 0 | 0 | direction= clockwise<br>starting position= 2<br>amount of crawl: 3 (3-0) |
| 101 | | 0 | 1 | 1 | 1 | 1 | 1 | 0 | direction= clockwise<br>starting position= 5,<br>amount of crawl: 2 (5-3) |
| 010 | | 0 | 0 | 0 | 0 | 1 | 1 | 0 | direction= clockwise<br>starting position= 2,<br>amount of crawl: -3 (2-5) |
| 101 | | 1 | 1 | 0 | 0 | 1 | 1 | 1 | direction= clockwise<br>starting position= 7,<br>amount of crawl: 3 (5-2) |

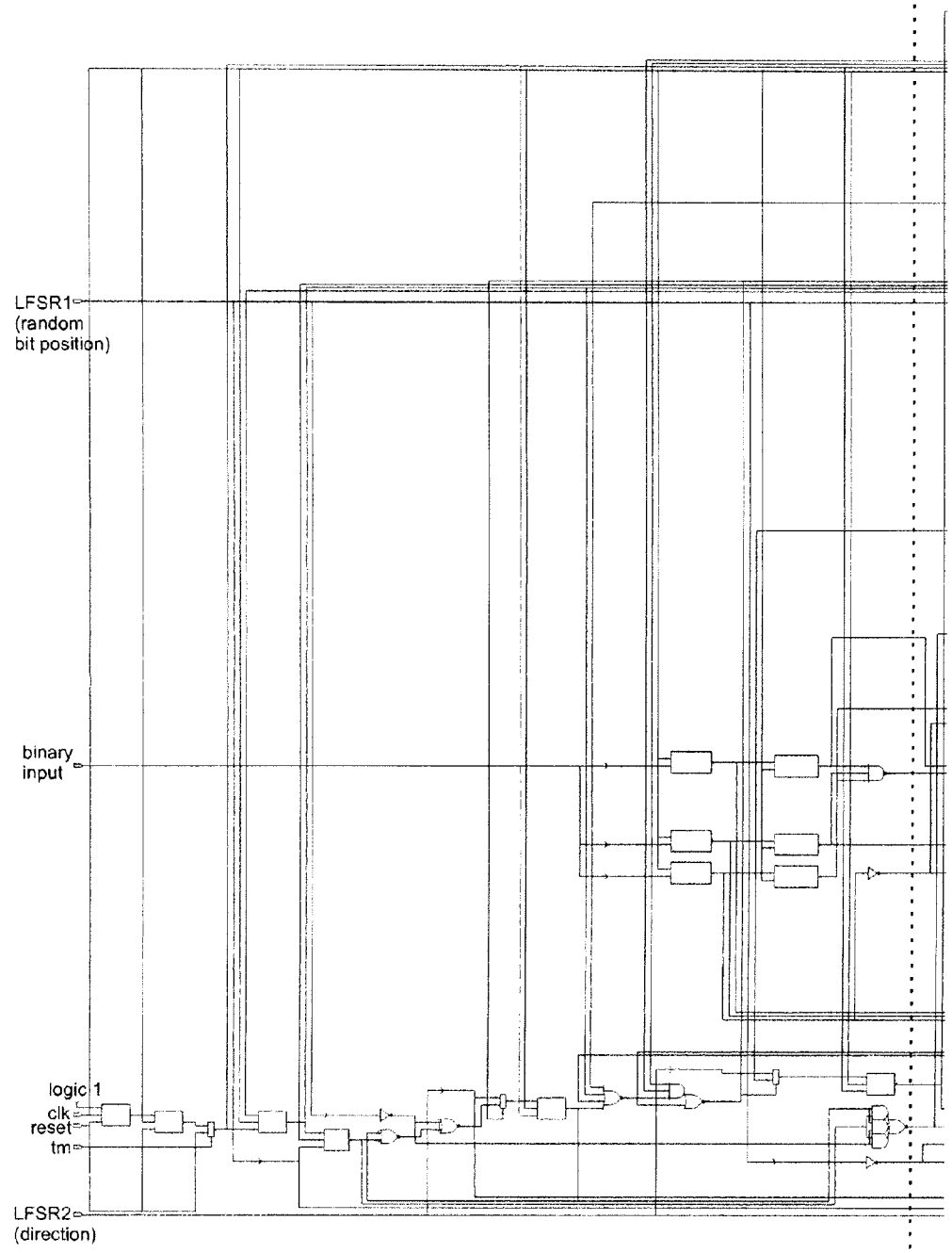

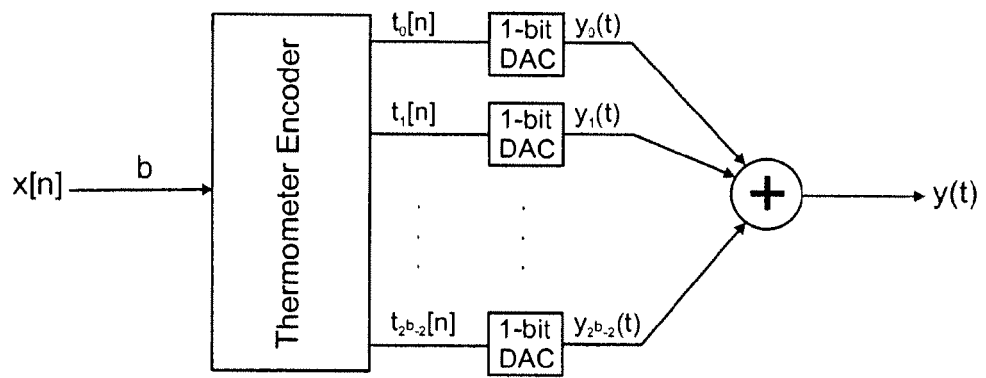
(Prior Art)  Fig. 8
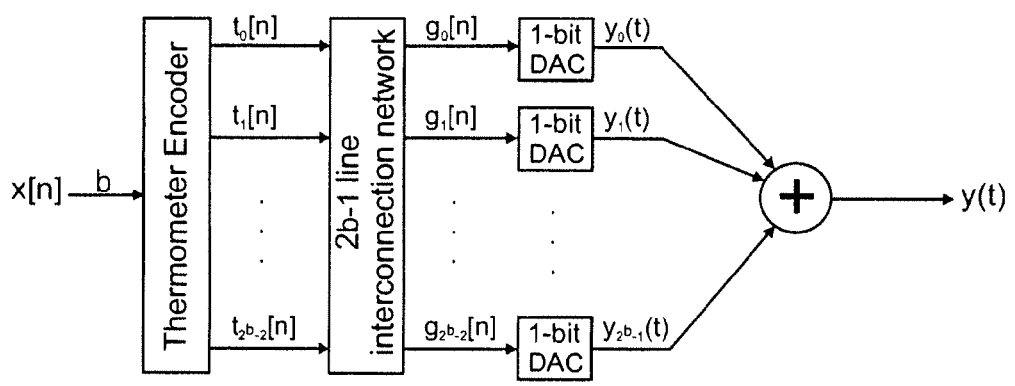
(Prior Art)  Fig. 9

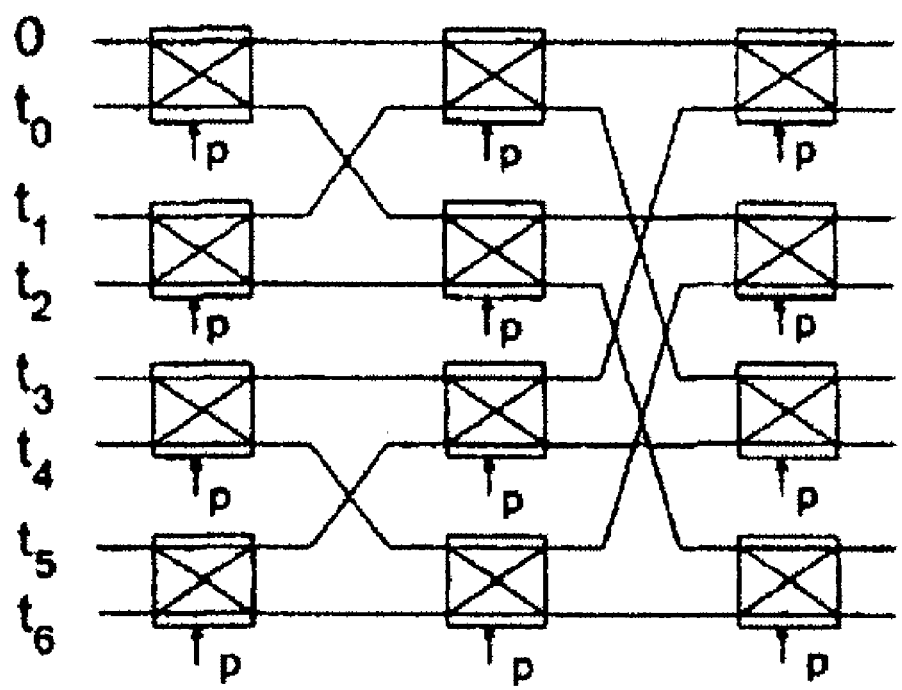
(Prior Art) Fig. 10

US 8,159,381 B2

GLITCH FREE DYNAMIC ELEMENT MATCHING SCHEME

RELATED APPLICATION

The present application claims priority of India Provisional Application No. 1112/DEL/2010 filed May 12, 2010, which is incorporated herein in its entirety by this reference.

FIELD OF THE INVENTION

The present invention relates to a dynamic element matching method and a circuit for implementing the dynamic element matching method.

BACKGROUND

FIG. 8 illustrates a digital to analog conversion system for converting a b-bit digital input signal x[n] into an analog output signal y(t). In said respect, the b-bit digital input signal is applied to a bit encoder (here a thermometer encoder), which translates the digital input signal x[n] to a further code t[n] (here a thermometer code as used in the system of WO 01/91300). The output of the bit encoder $t_0[n]$, $t_1[n]$ ..., $t_{2^b-2}[n]$ (total number of $2^b-1$) is input to a plurality ($2^b-1$) of 1-bit DAC elements to generate respective analog outputs $y_0(t), y_1(t) \ldots, y_{2^b-2}(t)$. These analog outputs of the plurality of 1-bit DAC elements are fed to an analog output summing node, that sums the respective analog outputs to generate the analog output signal y(t).

In the process of digital to analog conversion, the thermometer code output t[n], corresponding to the digital value of the input signal x[n], activates the unit value of the analog entities (which may be current or voltage sources). The analog output is the summation of all those activated analog entities.

Systems for digital to analog conversion use matched references, amplifiers and switches to perform the signal conversion. Typically, voltages or currents (see above) are generated by matched components, such as resistors, transistors and/or capacitors. However, perfectly matched components (i.e. having identical electrical properties) are practically impossible to fabricate. Because of variations in circuit fabrication processes, temperature gradients across the circuit, component aging and component noise, circuit component values differ from their design values. These variations, called mismatch errors, cause inaccurate output levels which leads to harmonic distortion that reduces the spurious-free dynamic range (SFDR) at the analog output.

For instance, with regard to the current steering thermometer DAC, since the geometry of the transistors, from which the current sources may be constructed, deviates from one another, the current will also deviate. Hence, the difference between each output level of the DAC varies, which introduces spurious tones in the output.

The SFDR relates to the nonideal output of a converter. When an ideal converter's input is a sinusoid, the output spectrum contains energy at the input's fundamental frequency and possibly at DC. When a nonideal converter's input is a sinusoid, spectral energy is located at frequencies other than that found in the output of an ideal converter. SFDR is the difference in amplitude between the largest of these spectral components, called spurs, and the amplitude of the one at the input's fundamental frequency.

Trimming and calibration have been used to decrease element mismatches and may result in high SFDR and small maximum output errors.

To decrease element mismatches, Static Element Matching (SEM) techniques may be used, such as special placement/layout techniques, laser trimming etc. For instance, the components may be placed close together in certain patterns and made sufficiently large to yield small relative errors. This reduces the variation between the components. However, SEM techniques will not compensate the errors occurring after the fabrication, e.g. aging, temperature variation.

Dynamic Element Matching (DEM) continuously compensates the analog mismatch errors by manipulating the digital circuitry as will be explained in the following. DEM for example can be used in digital-to-analog converters (DACs) to improve their spectral properties and achieve a high SFDR.

DEM randomizes the analog mismatch error at the output by switching ON and OFF the analog entity depending on the digital input in a sequence by which harmonic coherence is reduced and made into signal independent noise, in which case, the SFDR of the analog output is improved. Put differently, Digital DEM algorithms rearrange mismatched elements by reordering the bits of the digital inputs to the mismatched elements. Digital DEM algorithms use signal processing algorithms and interconnection networks to virtually permute the mismatched components.

In the following, the principle of DEM is exemplified using the system of FIG. 9, which, compared to the system of FIG. 8, additionally comprises a $2^b-1$ line interconnection network, between the thermometer encoder and the 1-bit DACs. The system performs DEM by mapping a b bit input signal x[n] to the $2^b-1$ single bit DACs through the $2^b-1$ line interconnection network. Using the interconnection network to randomize the mapping between the thermometer coded signal t[n] and the array of 1-bit DACs, the positions of mismatched unit DACs can be virtually altered.

With a deterministic DEM interconnection network, the shuffled thermometer coded signal, g[n], activates the single bit DACs chosen according to a deterministic algorithm. As a result of this random rearrangement of the 1-bit DACs, the mismatched components, which generally generate the harmonics, that now becomes white in nature and distributed in the whole frequency range.

With a stochastic DEM interconnection network, the shuffled thermometer coded signal, g[n], activates the single bit DACs chosen at random. In other words, by using DEM it is possible to select the 1-bit DACs in a random sequence with every operation of the DAC. As a result of this virtual random rearrangement of the 1-bit DACs, the mismatched components generate (white) noise instead of harmonic distortion, because the spreads are averaged across the entire spectrum. The spurious tones are thus removed; however, the noise floor is raised, which may result in a worsening of the signal-to-noise ratio. This may be compensated by applying oversampling.

Regardless of the particular DEM algorithm employed, the mismatched errors can be reduced and the SFDR of the analog output can be increased.

DEM algorithms can be used to reduce the mismatch error of many different elements, including capacitors, transistors and even complex structures, including current sources. DEM algorithms can be applied in all kinds of technical circuits in which a plurality of b-bit binary input codes are converted into a plurality of ($2^b-1$)-bit digital output codes.

A glitch is usually a short-lived fault in a system before the signal settles to its intended value. For instance, such a false output of short duration appears in logic circuits, when for a short time outputting a wrong result of a logical Boolean operation. A wrong output may be generated for short periods of time, especially for transitions between digital codes that have a large number of different bit values, such as 011 ... 11 and 100 ... 00. For a short moment, the maximal output code 111 ... 11 may appear, resulting in a large current spike on the output. Glitches are a severe problem since they put an upper limit on the speed-performance of digital-to-analog conversion systems.

When using a thermometer code for input to the 1-bit DACs (e.g. current sources), the switches of the 1-bit DACS will not be switched on and off at the same time, thus reducing glitches.

However, this good property of the thermometer code is usually spoiled when DEM is applied at the same time.

For instance, the prior art system presented in the International patent publication WO 01/91300 uses a thermometer code and a scrambler in order to implement DEM in a digital-to-analog converter. It is suggested therein to scramble N-bit thermometer data words into N-bit output data words using a randomizer switch network as illustrated in FIG. 10. The prior art uses numerous switches which are controlled by a random input signal p.

Because of the randomizer switch network of FIG. 10, the solution of WO 01/91300 uses a large area. A further drawback is that the design of the network is not scalable and thus, when increasing the bits of the input, the necessary area increases exponentially. In addition, there are large critical paths which may cause problems in high speed design.

Given the above problems with the prior art systems, it would be advantageous to provide a system which reduces glitches like the thermometer code, allows to use DEM to reduce mismatches in the components and further does not have the disadvantages of the prior art.

SUMMARY

According to a first aspect of the invention, a dynamic element matching method for converting a plurality of b-bit binary input codes into a plurality of $(2^b-1)$-bit digital output codes is provided. The decimal equivalent of a b-bit binary input code corresponds to the amount of binary "1"s in the corresponding $(2^b-1)$-bit digital output code. A random bit position of the binary "1" in a first $(2^b-1)$-bit digital output code is determined for a first b-bit binary input code. A random direction of clockwise or counter-clockwise is determined for each $(2^b-1)$-bit digital output code. The amount of binary "1"s in the first $(2^b-1)$-bit digital output code is positioned based on the determined random bit position and the random direction derived from the first $(2^b-1)$-bit output code. The decimal difference between a subsequent second b-bit binary input code and the first b-bit binary input code is determined. The second $(2^b-1)$-bit digital output code is determined by changing bits of the first $(2^b-1)$-bit digital output code according to the decimal difference and the determined random direction for the second $(2^b-1)$-bit digital output code.

According to an embodiment of the invention, the amount of binary "1"s are positioned in the first $(2^b-1)$-bit digital output code by setting the bit value to "1" at the random bit position and consecutively at bit positions being in the determined random direction from the random bit position.

In a further embodiment of the invention, the step of changing bits of the first $(2^b-1)$-bit digital output code is performed such that the amount of binary "1"s in the second $(2^b-1)$-bit digital output code remains consecutive.

For another embodiment of the invention, the second $(2^b-1)$-bit digital output code is determined by first determining those bit positions with binary "1"s in the first $(2^b-1)$-bit digital output code. Then, the particular bit positions, which bit value is to be changed, in the first $(2^b-1)$-bit digital output code to generate the second $(2^b-1)$-bit digital output code are determined based on the algebraic sign of the determined decimal difference, based on the determined particular bit positions of binary "1"s in the first $(2^b-1)$-bit digital output code and based on the determined random direction, wherein the number of the particular bit positions corresponds to the determined decimal difference. The bit value at the particular bit positions in the first $(2^b-1)$-bit digital output code is changed to the opposite binary value to generate the second $(2^b-1)$-bit digital output code.

According to a further embodiment of the invention, the algebraic sign of the decimal difference specifies whether binary "1"s or binary "0"s in the first $(2^b-1)$-bit digital output code are to be changed to the opposite binary value. The random direction in combination with the algebraic sign of the decimal difference specifies in the first $(2^b-1)$-bit digital output code the bit positions, which bit values are to be changed.

For another embodiment of the invention, it is assumed that the determined decimal difference has a positive algebraic sign such that the second $(2^b-1)$-bit digital output code has more binary "1"s than the first $(2^b-1)$-bit digital output code. In said case, in the first $(2^b-1)$-bit digital output code the particular bit positions are determined, which bit values are to be changed, to generate the second $(2^b-1)$-bit digital output code, such that the particular bit positions are consecutively located in the random direction next to the binary "1"s of the first in the first $(2^b-1)$-bit digital output code. Then, the bit value at the particular bit positions is set to a binary "1" to generate the second $(2^b-1)$-bit digital output code.

For a further embodiment of the invention, it is assumed that the determined decimal difference has a negative algebraic sign such that the second $(2^b-1)$-bit digital output code has less binary "1"s than the first $(2^b-1)$-bit digital output code. In this case, in the first $(2^b-1)$-bit digital output code the particular bit positions are determined, which bit values are to be changed, to generate the second $(2^b-1)$-bit digital output code, such that the first of the determined particular bit positions is that bit position with a binary "1" within the row of binary "1"s in the first $(2^b-1)$-bit digital output code which is located at the end opposite to the determined random direction. The remaining of the determined particular bit positions are those bit positions next to the first particular bit position in the random direction. The bit value at the particular bit positions is set to a binary "0" to generate the second $(2^b-1)$-bit digital output code.

According to another embodiment of the invention, the first and last bit position of the $(2^b-1)$-bit digital output code are considered to be consecutive in both of the random directions for the step of positioning the amount of binary "1"s in the first $(2^b-1)$-bit digital output code and the step of changing bits of the first $(2^b-1)$-bit digital output code.

In a further embodiment of the invention the determining of the decimal difference and the determining of the second $(2^b-1)$-bit digital output code are repeated to convert further b-bit binary input codes to corresponding $(2^b-1)$-bit digital output codes.

According to a further aspect of the invention, a code converter for converting a plurality of b-bit binary input codes into a plurality of $(2^b-1)$-bit digital output codes is provided. The decimal equivalent of a b-bit binary input code corresponds to the amount of binary "1"s in the corresponding $(2^b-1)$-bit digital output code. A first random number generator of the code converter randomly determines a random bit position in a first $(2^b-1)$-bit digital output code for a first b-bit binary input code. A second random number generator of the code converter randomly determines a random direction of clockwise or counter-clockwise for each $(2^b-1)$-bit digital output code. A processor of the code converter positions the amount of binary "1"s in the first $(2^b-1)$-bit digital output code based on the determined random bit position and the random direction for the first $(2^b-1)$-bit digital output code. A subtracting element of the code converter determines the decimal difference between a subsequent second b-bit binary input code and the first b-bit binary input code. The processor further determines the second $(2^b-1)$-bit digital output code by changing bits of the first $(2^b-1)$-bit digital output code according to the decimal difference and the determined random direction for the second $(2^b-1)$-bit digital output code.

In a further embodiment of the invention the processor of the code converter positions the amount of binary "1"s in the first $(2^b-1)$-bit digital output code by setting the bit value to "1" at the random bit position and consecutively at bit positions being in the determined random direction from the random bit position.

Referring to another embodiment of the invention, the processor changes bits of the first $(2^b-1)$-bit digital output code is performed such that the amount of binary "1"s in the second $(2^b-1)$-bit digital output code remains consecutive.

For an additional embodiment of the invention, the second $(2^b-1)$-bit digital output code is determined by the processor by determining those bit positions with binary "1"s in the first $(2^b-1)$-bit digital output code. Then particular bit positions, which bit value is to be changed, in the first $(2^b-1)$-bit digital output code to generate the second $(2^b-1)$-bit digital output code are determined based on the algebraic sign of the determined decimal difference, based on the determined particular bit positions of binary "1"s in the first $(2^b-1)$-bit digital output code and based on the determined random direction, wherein the number of the particular bit positions corresponds to the determined decimal difference. The bit value at the particular bit positions in the first $(2^b-1)$-bit digital output code is changed to the opposite binary value to generate the second $(2^b-1)$-bit digital output code.

For another embodiment of the invention, the algebraic sign of the decimal difference specifies whether binary "1"s or binary "0"s in the first $(2^b-1)$-bit digital output code are to be changed to the opposite binary value. The random direction in combination with the algebraic sign of the decimal difference specifies in the first $(2^b-1)$-bit digital output code the bit positions, which bit values are to be changed.

According to another embodiment of the invention, it is assumed that the determined decimal difference has a positive algebraic sign such that the second $(2^b-1)$-bit digital output code has more binary "1"s than the first $(2^b-1)$-bit digital output code. In this case, the processor determines in the first $(2^b-1)$-bit digital output code the particular bit positions, which bit values need to be changed, to generate the second $(2^b-1)$-bit digital output code, such that the particular bit positions are consecutively located in the random direction next to the binary "1"s of the first in the first $(2^b-1)$-bit digital output code. Then, the processor sets the bit value at the particular bit positions to a binary "1" to generate the second $(2^b-1)$-bit digital output code.

According to a further embodiment of the invention, the determined decimal difference is assumed to have a negative algebraic sign such that the second $(2^b-1)$-bit digital output code has less binary "1"s than the first $(2^b-1)$-bit digital output code. The processor determines the particular bit positions in the first $(2^b-1)$-bit digital output code, the bit values of which are to be changed, to generate the second $(2^b-1)$-bit digital output code, such that the first of the determined particular bit positions is that bit position with a binary "1" within the row of binary "1"s in the first $(2^b-1)$-bit digital output code which is located at the end opposite to the determined random direction and the remaining of the determined particular bit positions are those bit positions next to the first particular bit position in the random direction. The processor sets the bit value at the particular bit positions to a binary "0" to generate the second $(2^b-1)$-bit digital output code.

For a further embodiment of the invention the first and last bit position of the $(2^b-1)$-bit digital output code are considered to be consecutive in both of the random directions for the processor when positioning the amount of binary "1"s in the first $(2^b-1)$-bit digital output code and changing bits of the first $(2^b-1)$-bit digital output code.

In another embodiment of the invention the processor repeats determining the decimal difference and determining the second $(2^b-1)$-bit digital output code to convert further b-bit binary input codes to corresponding $(2^b-1)$-bit digital output codes.

According to a further aspect of the invention a b-bit digital-to-analog converter for converting a b-bit digital signal to an analog signal is provided. The converter comprises digital-to-analog converting elements for converting a digital input into an analog signal. An adder of the converter adds the converted analog signals output from the digital-to-analog converting elements to output an added analog signal. A code converter of the digital-to-analog converter converts a plurality of b-bit binary input codes into a plurality of $(2^b-1)$-bit digital output codes, and corresponds to the previous aspect of the invention. Each of the $(2^b-1)$-bit digital output codes from the code converter is input to the digital-to-analog converting elements to convert the $(2^b-1)$-bit digital output code to an analog signal.

BRIEF DESCRIPTION OF THE DRAWINGS

The accompanying drawings are incorporated into and form part of the specification to illustrate several embodiments of the present invention. These drawings together with the description serve to explain the principles of the invention. The drawings are only for the purpose of illustrating preferred and alternative examples of how the invention can be made and used and are not to be construed as limiting the invention to only the illustrated and described embodiments. Further features and advantages will become apparent from the following and more particular description of the various embodiments of the invention, as illustrated in the accompanying drawings, in which like reference numbers refer to like elements and wherein:

FIGS. 7A-7F show the exemplary circuit diagram of FIG. 7 in greater detail, wherein the illustrated circuit does not comprise the random number generators;

FIG. 8 illustrates the architecture of a DAC according to the prior art using a thermometer encoder;

FIG. 9 illustrates the architecture of a DAC according to the prior art using in addition a $2^b-1$ line interconnection network in order to implement dynamic element matching; and FIG. 10 illustrates the randomizer switch network used in the prior art system of WO 01/91300.

DETAILED DESCRIPTION OF PREFERRED EMBODIMENTS

In the figures and the following specification the term "1 bit DAC" denotes a circuit element capable of converting a digital (binary) input data into an analog signal, i.e. in the form of a current, charge or voltage. For instance, the 1-bit DAC may be a current/voltage source, a resistor array or a capacitor.

A "binary code" is to be understood as a number in the binary numerical system in which numeric values are represented using two symbols or values "1" and "0". The binary numerical system is a base-2 system.

A "digital code" is to be understood as a number being represented using the two binary symbols "1" and "0", however not belonging to a base-2 system. In other words, the various "1" and "0" of the digital code do not necessarily represent a decimal value, but in this case are used to control the various 1 bit DACs to for the analog output.

A "decimal difference" or "decimal equivalent" is to be understood as referring to the commonly used decimal numerical system, which base is 10.

Digital-to-analog converter is to be understood as an entity which converts an digital input into an analog output. Digital-to-analog converters does not only refer to standalone circuits but may be implemented in many more systems.

The present invention refers to a dynamic element matching technique for randomizing the output of a b-bit-binary to $(2^b-1)$ bit conversion. In general, the technique of the present invention is denoted in the following as the crawling code. In the following, an exemplary implementation is used to explain the invention. In more detail, the crawling code is implemented for illustration purposes in a digital-to-analog converter (see FIGS. 1 and 3). However, this is not to be understood as restricting the present invention for use in a digital-to-analog converter only.

Instead, the dynamic element matching technique of the present invention may be applied to all kinds of circuits. For instance, the invention may be used in a digital-to-analog converting element which is connected to the digital output of an analog-to-digital converter. By comparing the analog input and the analog output, the digital-to-analog element makes it possible to determine and improve the accuracy of the analog-to-digital conversion.

The crawling code generator of the invention may substitute a thermometer code in any circuit. Thermometer coders are known to be used internally in many circuits such as ADC and DAC architectures but also in other circuits such as in audio systems, machine control or PLL (Phase-locked-loop) circuits.

The previous examples are not to be construed as limiting the invention.

Figure 1:
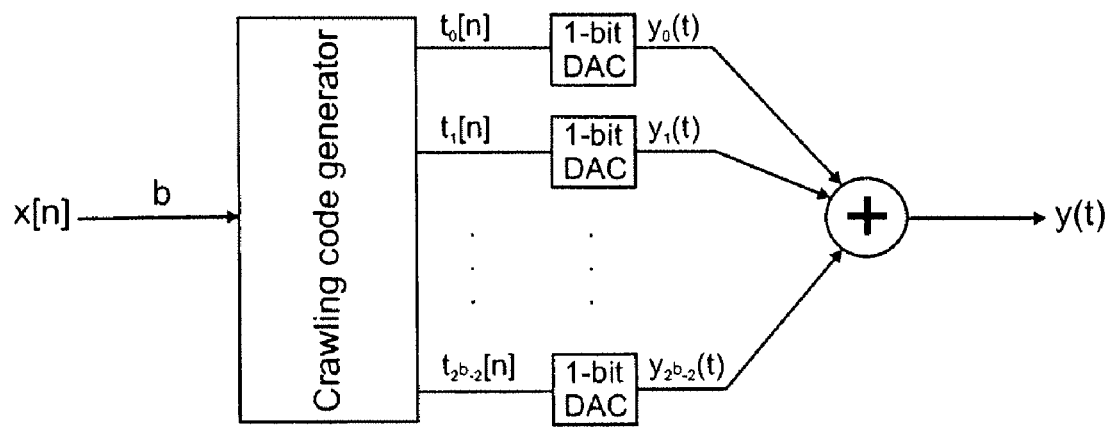
FIG. 1 illustrates the architecture of a DAC including the crawling code generator according to an embodiment of the present invention.

FIG. 1 illustrates the general architecture of a digital-to-analog converter including the crawling code generator according to an aspect of the invention. The DAC has an input for receiving a digital signal x[n]. The input is connected to the input of the crawling code generator, which converts the input binary signal into a different output digital signal $t_0[n]$-$t_{2^b-2}[n]$. The various outputs of the crawling code generator are respectively connected to 1-bit DACs, which are switchable according to their input so as to convert the input signal into analog outputs $y_0(t)$-$y_{2^b-2}(t)$. All the analog outputs of the 1-bit DACs are summed by a summer and output as the resulting analog signal y(t).

The code conversion applied by the crawling code generator will be explained in the following, assuming a 3-bit binary input signal for illustration purposes. It should be noted that the present invention is not only applicable to a 3-bit binary input signal, but to any binary input signals with b bits. The following examples being applicable to the 3-bit binary input signal are not to be construed as limiting the invention to these examples only.

The code conversion will be explained with reference to FIGS. 2, 3 and 4.

A b-bit binary code is input into the crawling code generator to be converted into a $(2^b-1)$-bit digital code according to one embodiment of the invention. In this case, a 3-bit binary input code is to be converted to a 7-bit digital output code. In general, the conversion is such that the digital output code of the crawling code generator comprises as many binary "1"s as the decimal equivalent of the 3-bit binary input. For instance, an input of 101 in the binary numerical system is equivalent to 5 in the decimal numerical system. The 7-bit crawling output code then comprises 5 binary "1"s, e.g. "0011111" or "1100111".

The correspondence between the number of "1"s in the crawling output code and the decimal value of the binary input applies to all crawling code outputs. The embodiment of the present invention determines the positioning of the "1"s and the changes of the "1"s from one output to another as follows.

It should be also noted that the five binary "1"s are to be placed in a "row" or "block", not in any random positions such as "1011011". In the above example "0011111", the five "1"s are in a row, i.e. constitute a block of "1"s. Assuming the digital 7-bit code to be circular (i.e. that the first and last bit positions of the output are considered to be consecutive), the five "1"s in the output code "1100111" are also in a "row", namely at consecutive positions 5, 6, 7, 1 and 2.

Figures 2, 3:
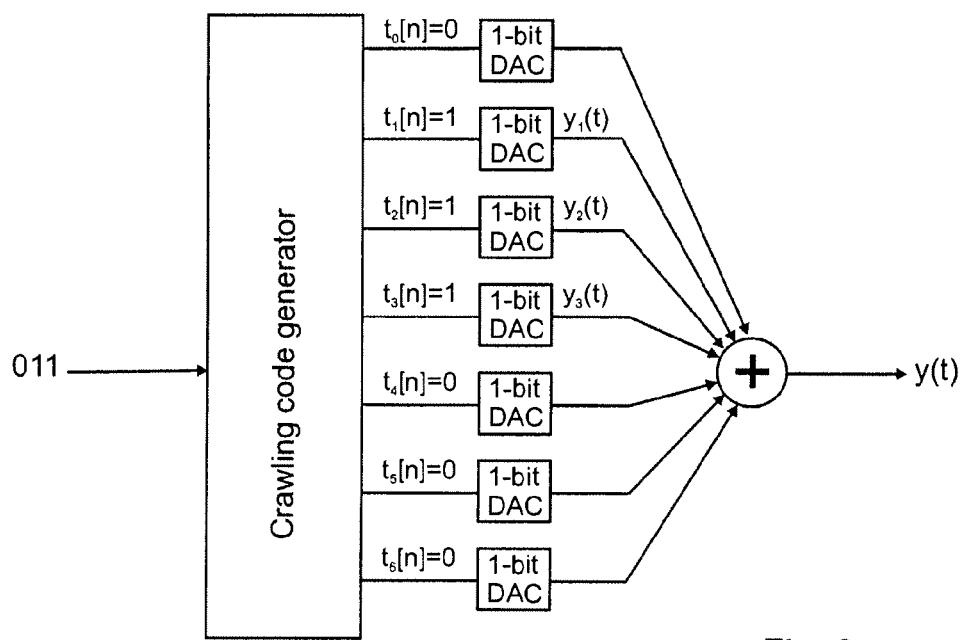
FIG. 2 illustrates the conversion of four binary input codes into corresponding digital crawling outputs codes according to an embodiment of the invention.
FIG. 3 illustrates the architecture of the DAC according to an embodiment of the present invention and shows the crawling output code as applied to the 1-bit DACs to generate analog signals that are summed.

For the first binary input code, set to 011 in the example of FIG. 2, the crawling code generator determines randomly a starting bit position among the 7-bit output code. In this case, it is assumed that the starting position is randomly set to bit position 2.

Furthermore, the crawling code generator determines randomly a direction to be used for positioning the "1"s in the crawling output code. The direction can be clockwise or counter-clockwise, and may also be denoted left or right, or up and down depending on point of view.

In more detail, when considering the 7-bit output code with the bit positions 1234567 a clockwise and right direction are equivalent. When looking at the switch array output of the crawling code generator as illustrated in FIG. 3, the clockwise and right direction correspond to a down direction. Conversely, a counter-clockwise, left direction and up direction are equivalent. Of course the definition of the direction depends on the point of view. In any case, the definition of the direction should be defined and used consistently in the algorithm explained in the following according to the various embodiments of the invention.

As mentioned above, the first input is 011, which is then converted into 0111000 according to the crawling code generator. In more detail, the binary input 011 corresponds to 3 in the decimal system, thus leading to three "1"s in the crawling output code. The starting position of the "111" block is bit position 2, as randomly determined before. The direction being clockwise (i.e. right) specifies which bit positions are to be changed apart from the bit at bit position 2, namely the consecutive ones in the determined clockwise direction, i.e. bit positions 3 and 4.

In case an anti-clockwise direction would have been determined before, the bits at the bit positions 2, 1 and 7 would have been changed to "1", arriving at the crawling output code 1100001 (not shown in figures).

The algorithm to be applied for the further binary inputs will be explained subsequently in general terms first, before then providing explicit examples on how to apply this algorithm.

In general, if the decimal difference between two subsequent binary input codes is positive (i.e. the crawling code output for the second binary input code has more "1"s than the crawling code output for the previous first binary input code), then the bit position(s) being in the determined direction next to the last "1" in the determined direction of the block of "1"s of the previous output crawling code will be set to "1".

Except for the first binary input, when a binary input is supplied to the crawling code generator to be converted into a crawling output code, the previous crawling output code is considered so as to determine the bit positions, the bit values of which are to be changed, in order to get the new crawling output code based on the decimal difference between the previous binary input and the current binary input and based on the direction which is randomly determined for each conversion.

As already explained before, the crawling output code comprises a "block" or "row" of "1"s, the amount of "1"s therein corresponding to the decimal equivalent of the corresponding binary input. In order to determine the bit positions that are to be changed compared to the previous crawling output code, the following is applied.

When the decimal difference is positive, binary "1"s are to be added (i.e. binary "0"s have to be changed to binary "1") to the previous crawling output code to arrive at the new crawling output code. The determined direction defines which bit position(s) will have to be changed. Considering the row of "1"s, if the direction is clockwise (right), then the consecutive bit positions in said clockwise (right) direction from the row of "1"s is to be changed. Conversely, if the direction is counter-clockwise (left), then the consecutive positions in said counter-clockwise (left) direction from the row of "1"s is to be changed.

When the decimal difference is negative, binary "1"s are to be removed from the previous crawling output code to arrive at the new crawling output code. Similarly, the determined direction defines which bits of the row of "1"s are to be changed back to "0". Considering the row of "1"s, if the direction is clockwise (right), then the first "1"s of the row of "1"s in said clockwise (right) direction are changed back to "0". Conversely, if the direction is counter-clockwise (left), then the first "1"s of the row of "1"s in said counter-clockwise (right) direction are changed back to "0".

The above will become clearer with the following explanation as to the second, third and fourth binary inputs to the crawling code generator.

The following refers to the example of FIG. 2 and in particular to the input of the second binary code, 101. The previous crawling output code is 0111000, and thus the row of "1"s is located at bit positions 2, 3 and 4. The direction is determined to remain clockwise. The decimal difference between the current and the previous binary input code is calculated, resulting in 101−011=010, which is equivalent to 2 in the decimal system. In other words, the decimal difference between to consecutive binary inputs determines the number of bit values that are to be changed in the new crawling output code compared to the previously output crawling code. In view of the algebraic sign of the decimal difference being positive, two additional "1"s have to be added.

Considering that the direction is clockwise and that the row of "1"s in the previous crawling output code is at bit positions 2, 3 and 4, the consecutive positions in clockwise direction are bit positions 5, 6, 7 etc. Since only 2 additional "1"s have to be added, the bit values at bit positions 5 and 6 are changed to "1". This results in the crawling output code 0111110, as can be seen in FIG. 2.

Figure 4:
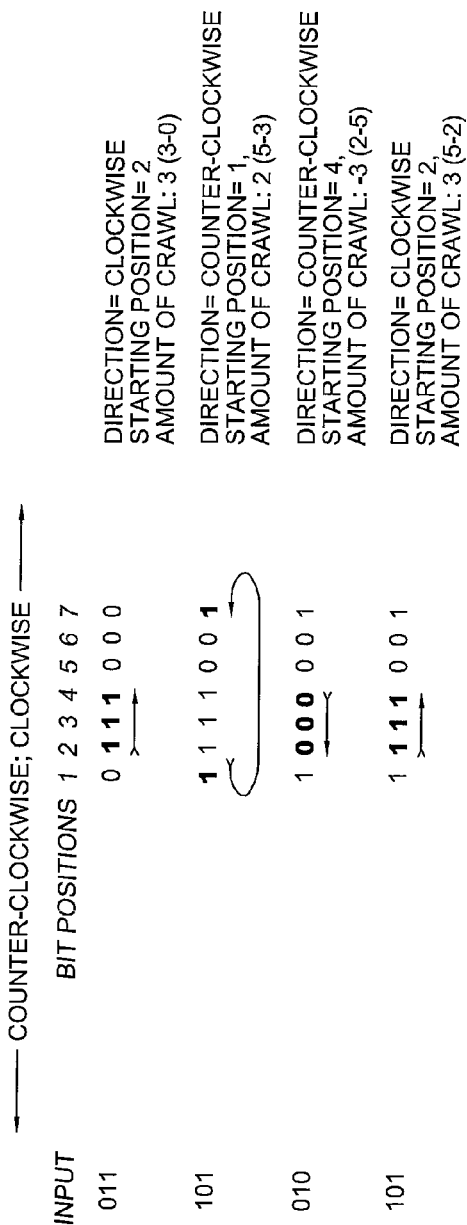
FIG. 4 illustrates the conversion of four binary input codes into corresponding digital crawling outputs codes according to a further embodiment of the invention.

Alternatively, as depicted in FIG. 4, if the direction for this second output code would have been randomly determined to be counter-clockwise (instead of clockwise), the bit value at bit positions 1 and 7 would have been changed to "1", thus rendering the output of the crawling code generator to be 1111001. In more detail, the row of "1"s in the previous crawling output code is at bit positions 2, 3 and 4. Thus, the consecutive positions in counter-clockwise direction are bit positions 1, 7, 6, 5 etc; in that order. Since two additional "1"s are to be added consecutively, the bit values at bit positions 1 and 7 are changed from "0" to "1".

It should be noted that the bit positions are considered circular, thus after bit position 1 in counter-clockwise direction follows bit position 7 as the consecutive one, and after bit position 7 in clockwise direction follows bit position 1 as consecutive one.

The third binary input code according to FIG. 2 is assumed to be 010. The decimal difference to the previous binary input code is −3 (=010−101; =2−5), i.e. the corresponding new digital crawling output code will have three binary "1"s less than the previous digital crawling output code for the second binary input code, which was 0111110. The direction is assumed to remain clockwise (right).

The row of "1"s in the previous crawling output code 0111110 is at bit positions 2-6. Since the direction is clockwise, the first "1"s of the row of "1"s in the clockwise direction are at bit positions 2, 3, 4, 5 and 6, in that order. Since three "1"s are to be changed back to "0", the bit values at bit positions 2, 3 and 4 are changed to "0", thus resulting in the new crawling output code 0000110.

As to the example encoding according to FIG. 4, the following steps are applied. The third binary input is also 010, and the decimal difference to the previous second binary input is −3 too. The previous output code for the second binary input was 1111001, thus having the row of "1"s at bit positions 7, 1, 2, 3 and 4. The amount of "1"s of the previous output code is to be reduced by three. Since the direction is still counter-clockwise in said example of FIG. 4, the first "1"s of the row of "1"s in the counter-clockwise direction are at bit positions 4, 3, 2, 1 and 7, in that order. In view of having to change three "1" bits to "0", the bit values at bit positions 4, 3 and 2 are changed back to "0", thus arriving at the coding result of 1000001.

Now referring again to FIG. 2, the fourth binary input sequence, 101, is input to the crawling code generator. It is assumed that the direction remains clockwise. The decimal difference between the fourth and third binary input sequence is 101−010=011, equivalent to 3 in the decimal numerical system. In other words, three additional "1"s have to be present in the crawling code output compared to the previous crawling code output, that was 0000110.

In order to determine at which bit positions the bit values are to be changed compared to the previous crawling output code, the clockwise (right) direction is considered as well as the fact that in the clockwise (right) direction the "1"-block, 11, is located at positions 5 and 6. Therefore, the consecutive bit positions in clockwise direction from the row of "1"s are 7, 1, 2, 3 etc., in that order. Correspondingly, the bit values at bit positions 7, 1 and 2 are changed from "0" to "1", thus resulting in the output code 1100111.

Conversely, the same methodology is applicable to the fourth binary input code 101 in the example of FIG. 4. The previous output crawling code for the third binary input code was 1000001, thus having the row of "1"s at bit positions 7 and 1. The direction is now determined to be clockwise, and the decimal difference between the current and previous binary input is 3, =101−010. In the clockwise (right) direction, the first bit positions after the row of "1"s are 2, 3, 4, 5 etc, in that order. Therefore, the bit values at bit positions 2, 3 and 4 are changed from "0" to "1", resulting in the fourth crawling output code of 1111001.

The DEM is implemented in the above-explained algorithm which randomizes the digital output provided by the crawling code generator. The random direction detection and the way of the resulting positioning of "1"s in the output code allows a random selection of the various 1-bit DACs.

FIG. 3 illustrates the architecture of the DAC and the generated output in case the binary code 011 is input into the crawling code generator. As can be seen in FIG. 3 the inputs to the seven 1-bit DACs is 0111000, in correspondence with the assumptions made for the first binary input in the example of FIGS. 2 and 4. Only output signals $t_1[n]$, $t_2[n]$ and $t_3[n]$ are 1 and thus only the corresponding 1-bit DACs are switched on, providing analog outputs $y_1(t)$, $y_2(t)$ and $y_3(t)$ to the summer to create the output analog signal y(t).

The crawling code generator includes two random number generators that may be respectively implemented by using a Linear Feedback Shift Register (LFSR). The two LFSR generate pseudo-random numbers that may be used to determine the starting bit position for the first binary input conversion and the direction for every conversion of binary input data.

The crawling code generator according to the previously described embodiments has at least the following advantages.

By determining the decimal difference and applying the crawling code algorithm to control the 1-bit DACs, only the minimal number of 1-bit DACs is switched on or off.

Figure 5:
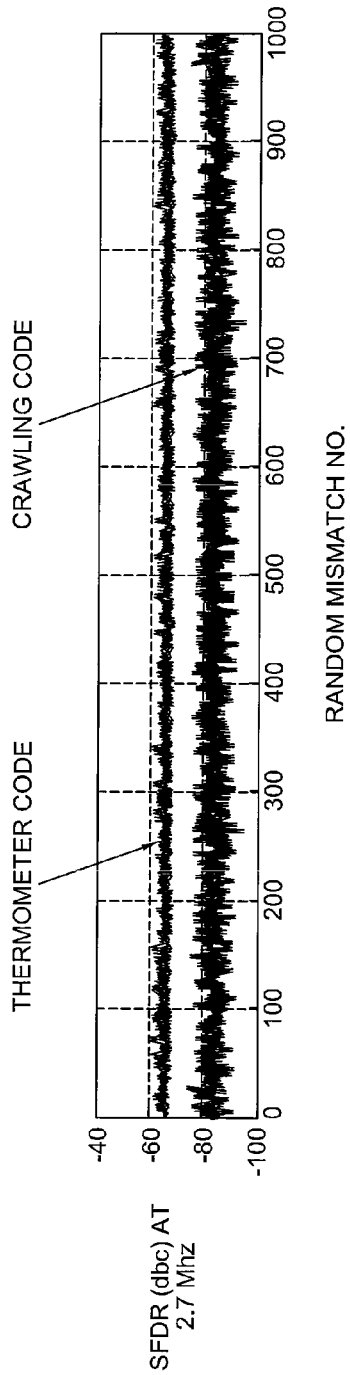
FIG. 5 is an SFDR diagram comparing the SFDR of the crawling code with the thermometer code.

FIG. 5 illustrates the SFDR in dB referenced to the carrier and compares the crawling code with the thermometer code. A simulation is performed assuming a DAC-system having a number of mismatches between 0 and 1000 and measures the SFDR at different levels of mismatch. For a particular frequency of 2.7 MHz, the simulation determines the SFDR when using the thermometer code and the crawling code according to one embodiment of the invention. The result of the simulation is depicted in FIG. 5. As apparent, there is a difference of about 15-20 dB between the thermometer code and the crawling code according to one embodiment of the invention. Thus, the SFDR could be significantly improved.

In addition, the crawling code generator uses only a small area, comparable to a thermometer code generator and thus has only a minimal area penalty. In addition, the crawling code generator scales well, i.e. with increasing input bits the circuit area increases only linearly not exponentially as in the prior art.

Furthermore, there is only a low group delay (latency) for generating the output. In other words, the number of clocks it takes for the input to show at the output is low, usually 1 or maximal 2 clock cycles.

As mentioned in the background section, glitches are reduced using the crawling code since the switches of the current sources will not be switched on and off at the same time.

Figure 6:
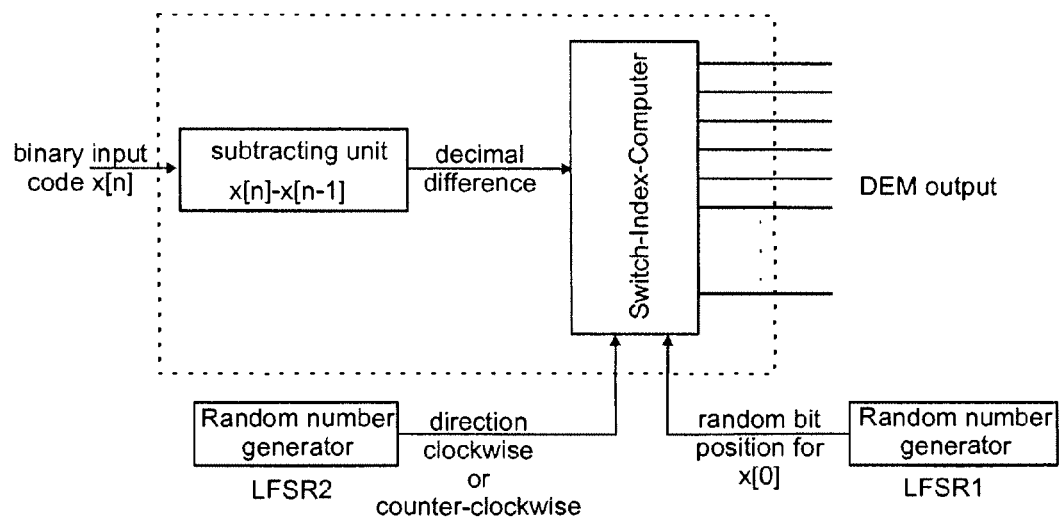
FIG. 6 illustrates a high-level overview of the crawling-code generator according to an embodiment of the invention.

FIG. 6 discloses the high level architecture of the crawling code generator as employed in the exemplary DAC according to FIG. 1. A b-bit binary input code x[n] is input to a subtracting unit that performs the operation x[n]−x[n−1], thereby generating the decimal difference between the current binary input code and the previous binary input code. This decimal difference is input to the switching-index-computer which is responsible for outputting the digital code to control the $2^b-1$ digital-to-analog converting elements.

In addition, two random number generators, such as LFSRs, are provided in the system to randomly determine a direction (clockwise or counter-clockwise for each conversion) and the starting bit position for the first input, in this case assumed to be x[0].

Consequently, the first binary code x[0] is input to the subtracting unit, which subtracts the previous binary code from x[0]. Since no previous binary code was input, zero is subtracted from x[0]; x[0]−0. The decimal difference in this case corresponds to the decimal equivalent of x[0].

For the conversion of the first binary code x[0] into an analog output, a random bit position is determined by random number generator LFSR1. The other random number generator LFSR2 determines a direction. Based thereon, the switch-index-computer can convert the binary input code into a digital code that controls the various 1-bit DAC elements.

With regard to the subsequent binary input codes x[1], x[2] ... x[n], each binary input code is input to the subtracting unit and a corresponding subtracting operation is performed. The random number generator LFSR2 determines for every conversion a particular direction of clockwise or counter-clockwise. The random number generator LFSR1 can be used for the first conversion; also it may be used to determine the random bit position for the present binary code when the previous binary code is all ones (code=7) or all zeros (code=0), but need not be used in other cases. The switch-index-computer processes all inputs and generates the digital output code for switching the analog sources, such as a current source.

In the following an exemplary implementation of an embodiment of the invention will be presented and explained. It should be noted that the following is only an example of how the embodiment of the invention may be realized. It should not be construed as limiting the invention to only this exemplary implementation. Rather, a skilled person once understanding the above-described principles of the invention and the crawling code algorithm is able to provide a different circuit design than the one which will be discussed below. For example, he will use hardware description languages such as VHDL (Very High Speed Integrated Circuit (VHSIC) Hardware Description Language) or Verilog HDL.

HDL (Hardware Description Language) based design has established itself as the modern approach to design of digital systems, with VHDL and Verilog HDL being the two dominant HDLs.

RTL stands for Register-Transfer Level. It is an essential part of top-down digital design process. Logic synthesis offers an automated route from an RTL design to a Gate-Level design. In RTL design a circuit is described as a set of registers and a set of transfer functions describing the flow of data between the registers. As an important part of a complex design, this division is the main objective of the hardware designer using synthesis.

The following exemplary circuit has been modeled using VHDL and then synthesized. Synthesis is usually known as an automatic method of converting a higher level of abstraction (RTL) to a lower level of abstraction (gate level netlists). Put differently, synthesis produces technology-specific implementation from technology-independent VHDL description. The circuit of FIG. 7 (block diagram), 7A-7F (gate level) represents a synthesized VHDL RTL.

Figure 7:
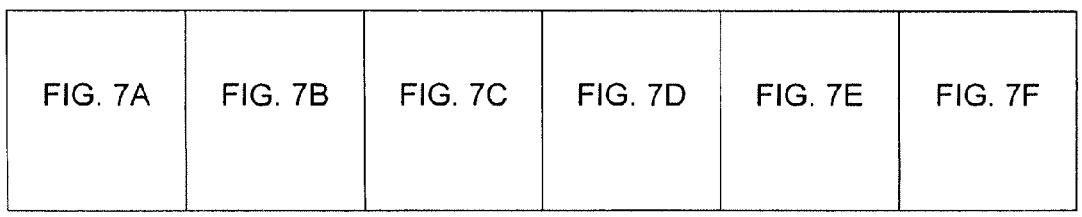
FIG. 7 shows an exemplary circuit diagram of the crawling code generator in block diagram format according to one embodiment of the invention.
Figure 7B:
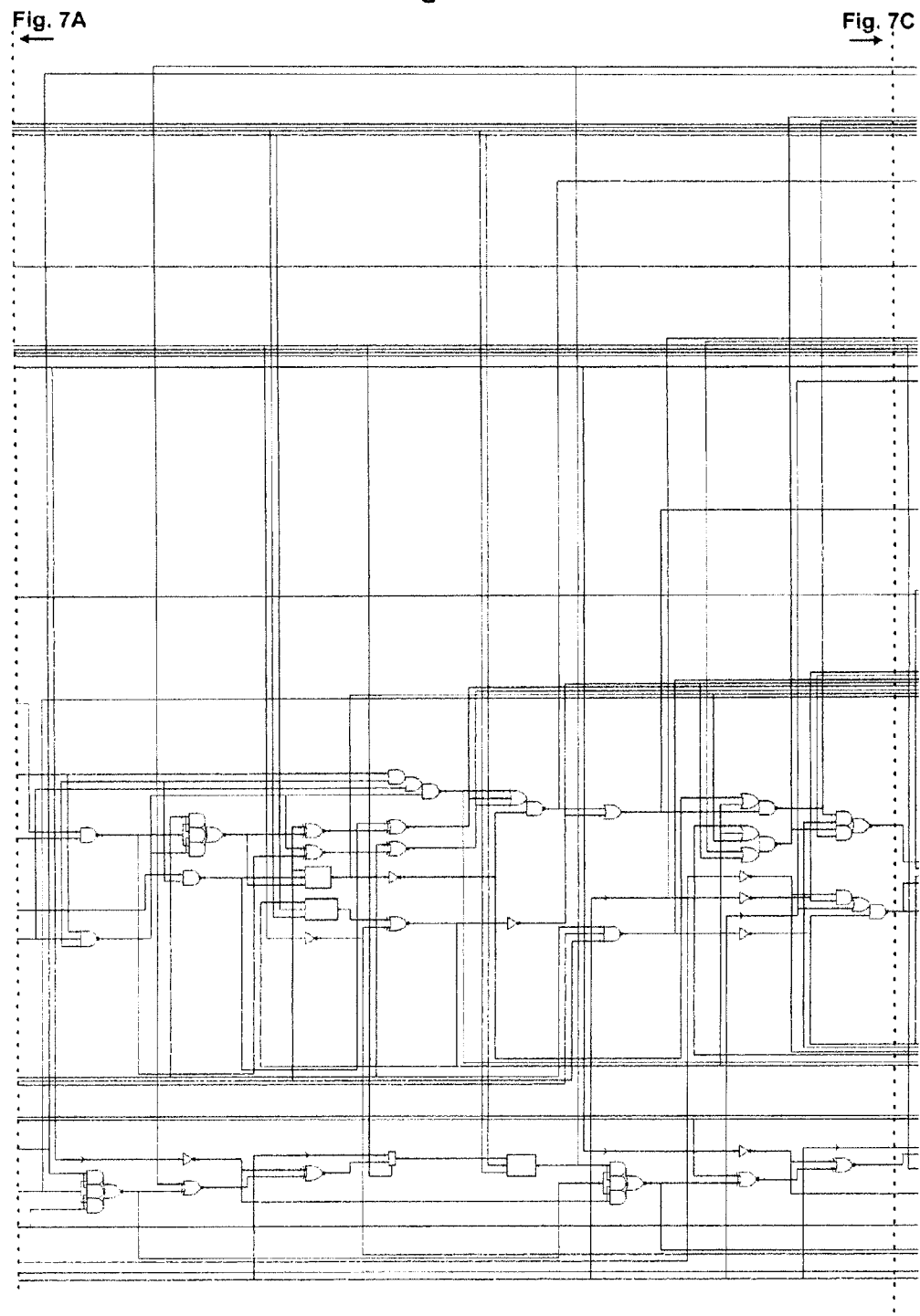
Figure 7C:
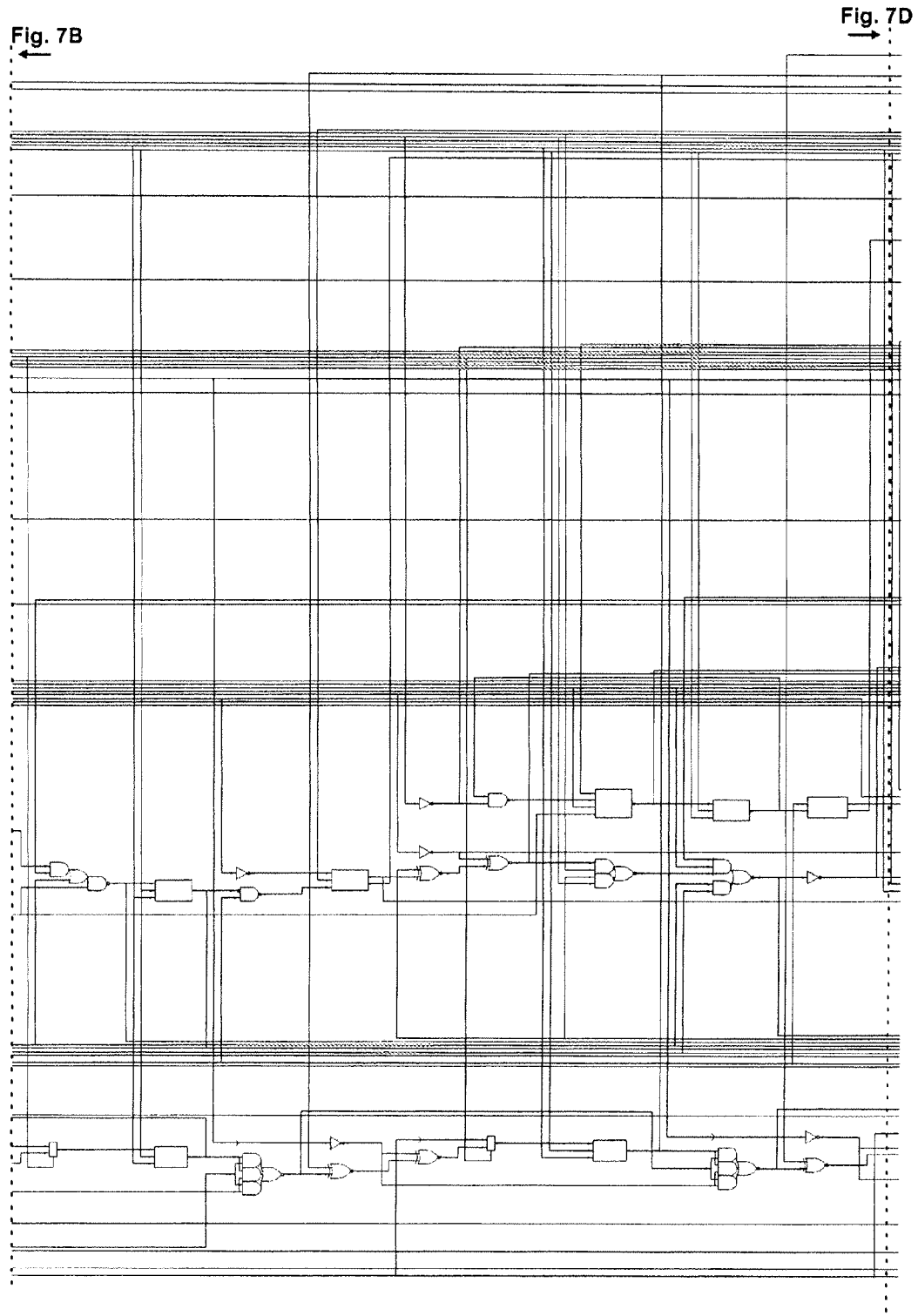
Figure 7D:
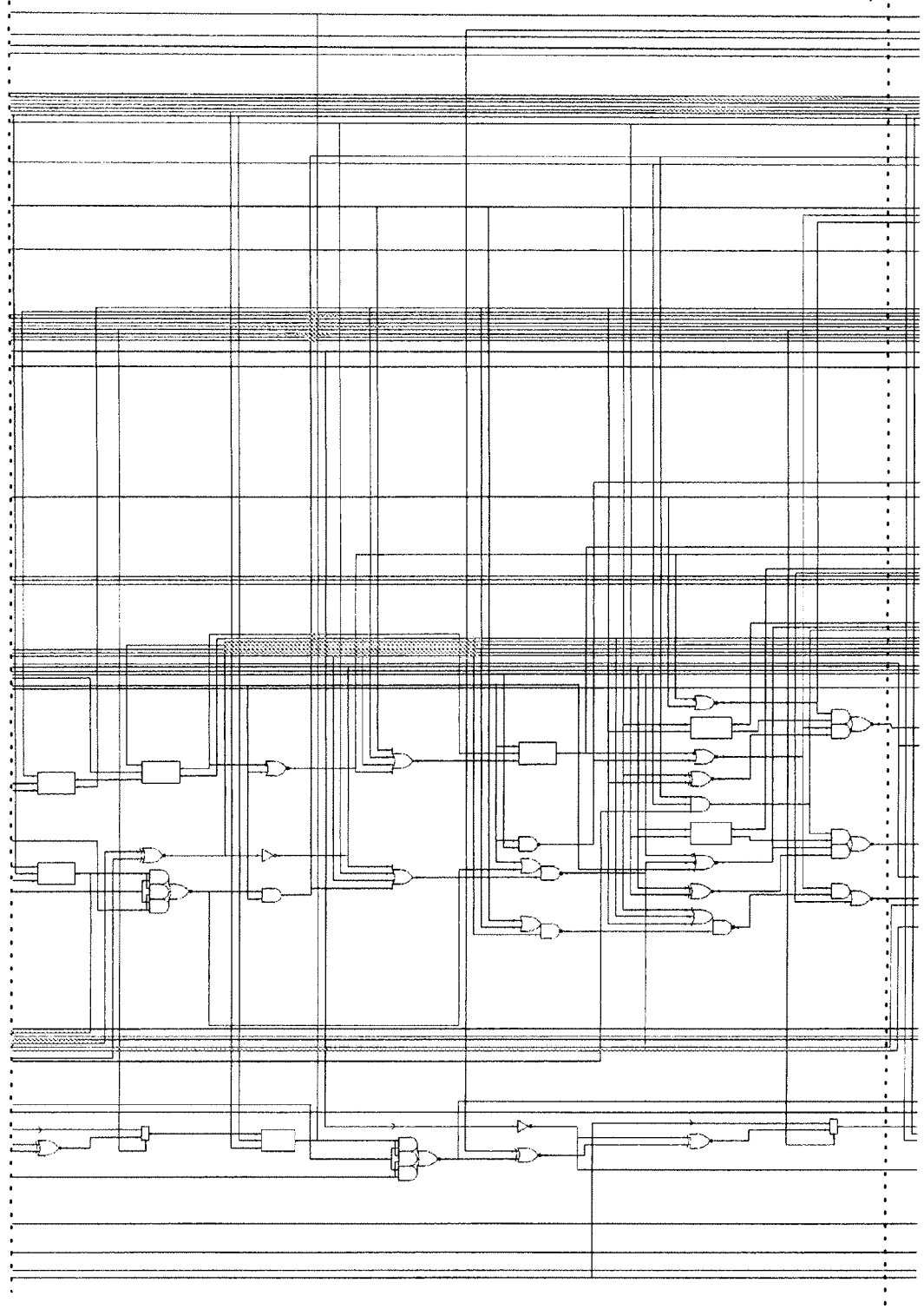
Figure 7E:
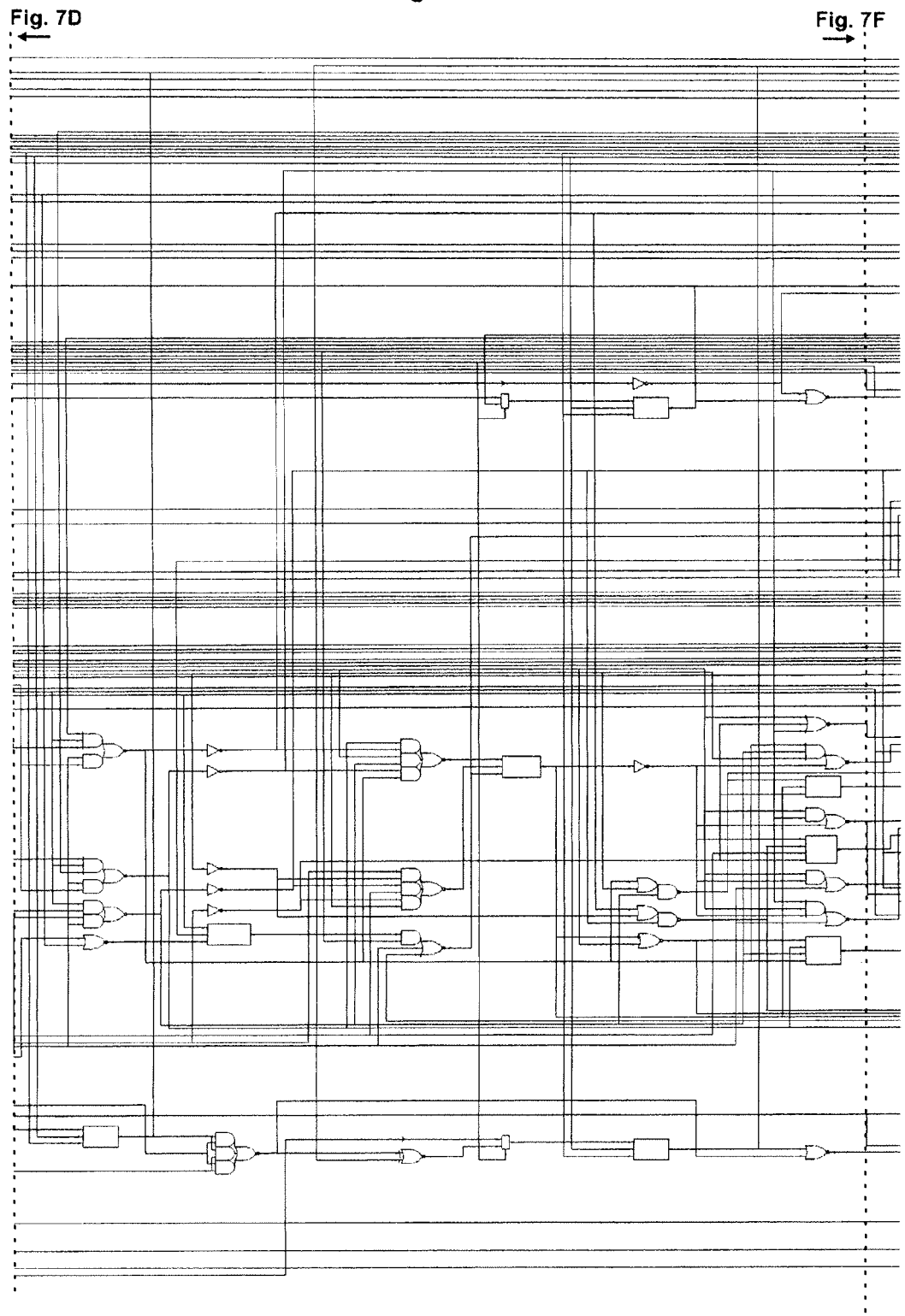

FIG. 7 illustrates the complete circuit structure at the block diagram level for an exemplary implementation of an embodiment of the crawling code generator. FIG. 7A-7F illustrate in greater detail the circuit structure of FIG. 7. The dashed lines in FIG. 7A-7F indicate how the figures are interconnected between each other to form the exemplary circuit of the FIG. 7 block diagram.

The circuit shown in FIG. 7 (block diagram), 7A-7F (gate level) refers to the crawling code generator without the two random number generators for determining the random bit position for the first conversion and the random direction for each conversion step. With regard to FIG. 6, the circuit of FIG. 7 thus corresponds to the dashed box, comprising the subtracting unit and the switch-index-computer.

The "main" inputs of the circuit of FIG. 7 are illustrated in FIG. 7A:
the random bit position for the first conversion (LFSR1)
the random direction for each conversion (LFSR2)
the binary input (e.g. 011, 101 according to FIG. 4)
Furthermore, the following inputs are also provided.
a logic 1
a clock signal
a reset signal
a tm signal, which is test-mode or scan mode input. This input is used in digital circuits for "Design for Testability"

Figure 7F:
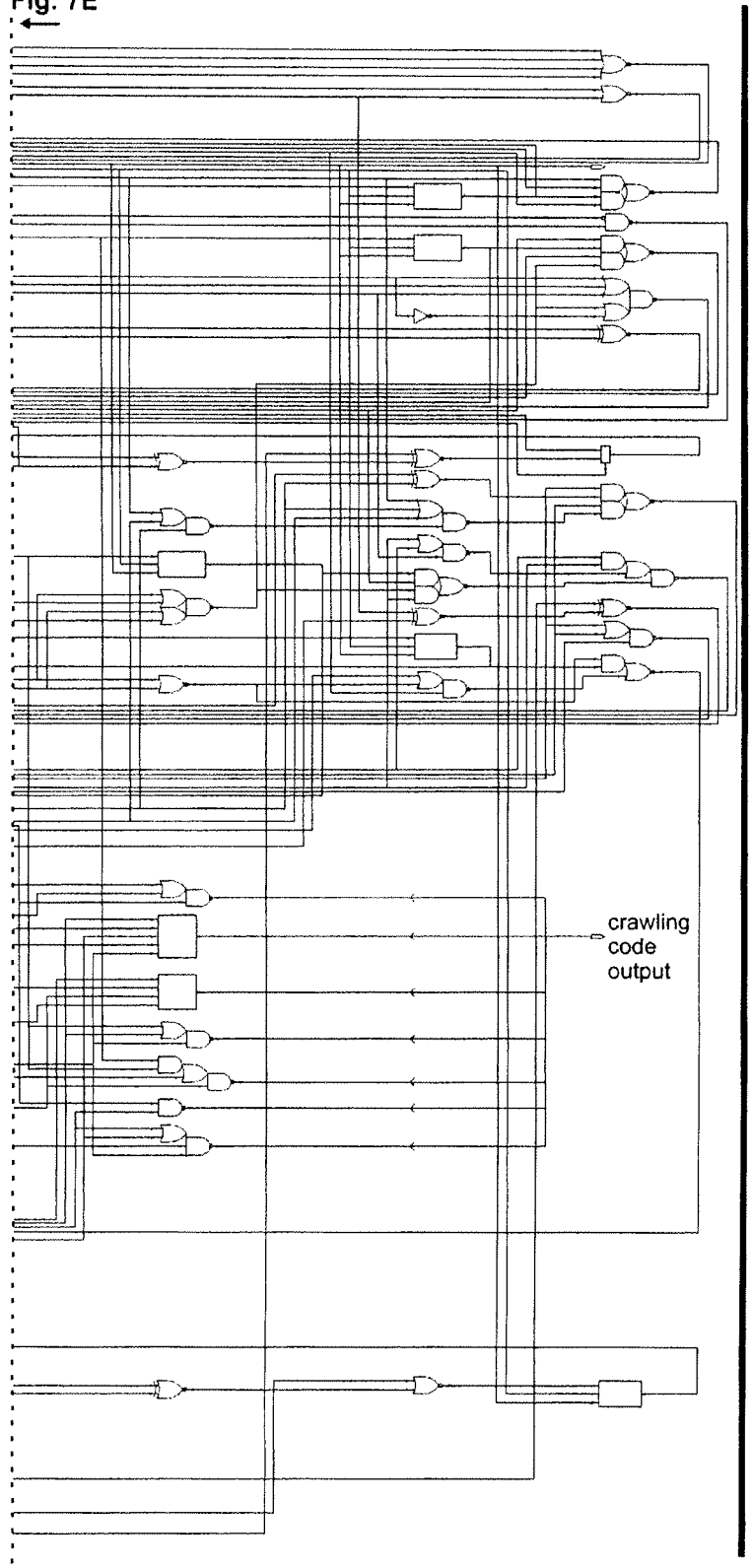

The crawling code output of the circuit can be seen in FIG. 7F, which is a 7-bit [6:0] output bus.

The crawling code generator itself can be implemented using flip-flops, multiplexors and conventional logic gates and inverters as apparent from the detailed illustration of FIG. 7A-7F. The rectangles correspond to multiplexors and flip-flops in the following manner: a two-input, one output rectangle with a further control input is a multiplexor; a three input, one output rectangle without a further control input is a flip-flop; a two input, one output rectangle without a further control input is a latch; a four input, one output rectangle without a further control input is a scannable flip-flop; a five input, one output rectangle without a further control input is a five-input OR gate; a two input, two output rectangle without a further control input is a non-resetable flip-flop (Q/Qbar); and a three input, two output rectangle without a further control input is a resetable flip-flop (Q/Qbar).

In addition, those areas in which it is believed that those of ordinary skill in the art are familiar have not been described herein in order not to unnecessarily obscure the invention described. For example, it will be readily apparent to those skilled in the art that innumerable other logic-level implementations of the present invention can be realized.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Accordingly, it has to be understood that the invention is not to be limited by the specific illustrative embodiments, but only by the scope of the appended claims.

We claim:

1. A dynamic element matching method for converting a plurality of b-bit binary input codes into a plurality of $(2^b-1)$-bit digital output codes, wherein the decimal equivalent of a b-bit binary input code corresponds to the amount of binary ones in the corresponding $(2^b-1)$-bit digital output code, the dynamic element matching method comprising:
determining a random bit position in a first $(2^b-1)$-bit digital output code for a first b-bit binary input code,
determining a random direction of clockwise or counter-clockwise for each $(2^b-1)$-bit digital output code,
positioning the amount of binary ones in the first $(2^b-1)$-bit digital output code based on the determined random bit position and the random direction for the first $(2^b-1)$-bit digital output code,
determining the decimal difference between a subsequent second b-bit binary input code and the first b-bit binary input code, and
determining the second $(2^b-1)$-bit digital output code by changing bits of the first $(2^b-1)$-bit digital output code according to the decimal difference and the determined random direction for the second $(2^b-1)$-bit digital output code.

2. The dynamic element matching method according to claim 1, wherein the amount of binary ones are positioned in the first $(2^b-1)$-bit digital output code by setting the bit value to one at the random bit position and consecutively at bit positions being in the determined random direction from the random bit position.

3. The dynamic element matching method according to claim 2, wherein the step of changing bits of the first $(2^b-1)$-bit digital output code is performed such that the amount of binary ones in the second $(2^b-1)$-bit digital output code remains consecutive.

4. The dynamic element matching method according to claim 1, wherein the second $(2^b-1)$-bit digital output code is determined by:
determining those bit positions with binary ones in the first $(2^b-1)$-bit digital output code,
determining particular bit positions, which bit value is to be changed, in the first $(2^b-1)$-bit digital output code to generate the second $(2^b-1)$-bit digital output code based on the algebraic sign of the determined decimal difference, based on the determined particular bit positions of binary ones in the first $(2^b-1)$-bit digital output code and based on the determined random direction, wherein the number of the particular bit positions corresponds to the determined decimal difference, and
changing the bit value at the particular bit positions in the first $(2^b-1)$-bit digital output code to the opposite binary value to generate the second $(2^b-1)$-bit digital output code.

5. The dynamic element matching method according to claim 1, wherein the algebraic sign of the decimal difference specifies whether binary ones or binary zeroes in the first $(2^b-1)$-bit digital output code are to be changed to the opposite binary value, and wherein the random direction in combination with the algebraic sign of the decimal difference specifies in the first $(2^b-1)$-bit digital output code the bit positions, which bit values are to be changed.

6. The dynamic element matching method according to claim 1, wherein the determined decimal difference has a positive algebraic sign such that the second $(2^b-1)$-bit digital output code has more binary ones than the first $(2^b-1)$-bit digital output code, the method comprising:
   determining in the first $(2^b-1)$-bit digital output code the particular bit positions, which bit values are to be changed, to generate the second $(2^b-1)$-bit digital output code, such that the particular bit positions are consecutively located in the random direction next to the binary ones of the first in the first $(2^b-1)$-bit digital output code, and
   setting the bit value at the particular bit positions to a binary one to generate the second $(2^b-1)$-bit digital output code.

7. The dynamic element matching method according to claim 1, wherein the determined decimal difference has a negative algebraic sign such that the second $(2^b-1)$-bit digital output code has less binary "1"s than the first $(2^b-1)$-bit digital output code, the method comprising:
   determining in the first $(2^b-1)$-bit digital output code the particular bit positions, which bit values are to be changed, to generate the second $(2^b-1)$-bit digital output code, such that the first of the determined particular bit positions is that bit position with a binary one within the row of binary ones in the first $(2^b-1)$-bit digital output code which is located at the end opposite to the determined random direction and the remaining of the determined particular bit positions are those bit positions next to the first particular bit position in the random direction, and
   setting the bit value at the particular bit positions to a binary zero to generate the second $(2^b-1)$-bit digital output code.

8. The dynamic element matching method according to claim 1, wherein the first and last bit position of the $(2^b-1)$-bit digital output code are considered to be consecutive in both of the random directions for the step of positioning the amount of binary ones in the first $(2^b-1)$-bit digital output code and the step of changing bits of the first $(2^b-1)$-bit digital output code.

9. The dynamic element matching method according to claim 1, wherein the steps of determining the decimal difference and determining the second $(2^b-1)$-bit digital output code are repeated to convert further b-bit binary input codes to corresponding $(2^b-1)$-bit digital output codes.

10. A code converter for converting a plurality of b-bit binary input codes into a plurality of $(2^b-1)$-bit digital output codes, wherein the decimal equivalent of a b-bit binary input code corresponds to the amount of binary ones in the corresponding $(2^b-1)$-bit digital output code, the code converter comprising:
   a first random number generator for randomly determining a random bit position in a first $(2^b-1)$-bit digital output code for a first b-bit binary input code,
   a second random number generator for randomly determining a random direction of clockwise or counter-clockwise for each $(2^b-1)$-bit digital output code,
   a processor for positioning the amount of binary ones in the first $(2^b-1)$-bit digital output code based on the determined random bit position and the random direction for the first $(2^b-1)$-bit digital output code,
   a subtracting element for determining the decimal difference between a subsequent second b-bit binary input code and the first b-bit binary input code, and
   the processor for determining the second $(2^b-1)$-bit digital output code by changing bits of the first $(2^b-1)$-bit digital output code according to the decimal difference and the determined random direction for the second $(2^b-1)$-bit digital output code.

11. The code converter according to claim 10, wherein the processor positions the amount of binary ones in the first $(2^b-1)$-bit digital output code by setting the bit value to one at the random bit position and consecutively at bit positions being in the determined random direction from the random bit position.

12. The code converter according to claim 11, wherein the processor changes bits of the first $(2^b-1)$-bit digital output code is performed such that the amount of binary ones in the second $(2^b-1)$-bit digital output code remains consecutive.

13. The code converter according to claim 12, wherein the second $(2^b-1)$-bit digital output code is determined by the processor by:
   determining those bit positions with binary ones in the first $(2^b-1)$-bit digital output code,
   determining particular bit positions, which bit value is to be changed, in the first $(2^b-1)$-bit digital output code to generate the second $(2^b-1)$-bit digital output code based on the algebraic sign of the determined decimal difference, based on the determined particular bit positions of binary ones in the first $(2^1-1)$-bit digital output code and based on the determined random direction, wherein the number of the particular bit positions corresponds to the determined decimal difference, and
   changing the bit value at the particular bit positions in the first $(2^b-1)$-bit digital output code to the opposite binary value to generate the second $(2^b-1)$-bit digital output code.

14. The code converter according to claim 13, wherein the algebraic sign of the decimal difference specifies whether binary ones or binary zeroes in the first $(2^b-1)$-bit digital output code are to be changed to the opposite binary value, and wherein the random direction in combination with the algebraic sign of the decimal difference specifies in the first $(2^b-1)$-bit digital output code the bit positions, which bit values are to be changed.

15. The code converter according to claim 14, wherein the determined decimal difference has a positive algebraic sign such that the second $(2^b-1)$-bit digital output code has more binary ones than the first $(2^b-1)$-bit digital output code, the code converter comprises:
   the processor for determining in the first $(2^b-1)$-bit digital output code the particular bit positions, which bit values are to be changed, to generate the second $(2^b-1)$-bit digital output code, such that the particular bit positions are consecutively located in the random direction next to the binary ones of the first in the first $(2^b-1)$-bit digital output code, and
   the processor for setting the bit value at the particular bit positions to a binary one to generate the second $(2^b-1)$-bit digital output code.

16. The code converter according to claim 14, wherein the determined decimal difference has a negative algebraic sign such that the second $(2^b-1)$-bit digital output code has less binary ones than the first $(2^b-1)$-bit digital output code, the code converter comprising:
   the processor for determining in the first $(2^b-1)$-bit digital output code the particular bit positions, which bit values are to be changed, to generate the second $(2^b-1)$-bit digital output code, such that the first of the determined particular bit positions is that bit position with a binary one within the row of binary ones in the first $(2^b-1)$-bit digital output code which is located at the end opposite to the determined random direction and the remaining of the determined particular bit positions are those bit positions next to the first particular bit position in the random direction, and the processor for setting the bit value at the particular bit positions to a binary zero to generate the second $(2^b-1)$-bit digital output code.

17. The code converter according to claim 15, wherein the first and last bit position of the $(2^b-1)$-bit digital output code are considered to be consecutive in both of the random directions for the processor when positioning the amount of binary ones in the first $(2^b-1)$-bit digital output code and changing bits of the first $(2^b-1)$-bit digital output code.

18. The code converter according to claim 10, wherein the processor repeats determining the decimal difference; and determining the second $(2^b-1)$-bit digital output code to convert further b-bit binary input codes to corresponding $(2^b-1)$-bit digital output codes.

19. A b-bit digital-to-analog converter for converting a b-bit digital signal to an analog signal, comprising:
digital-to-analog converting elements for converting a digital input into an analog signal,
an adder for adding the converted analog signals output from the digital-to-analog converting elements to output an added analog signal, and
a code converter for converting a plurality of b-bit binary input codes into a plurality of $(2^b-1)$-bit digital output codes, according to claim 10,
wherein each of the $(2^b-1)$-bit digital output codes from the code converter is input to the digital-to-analog converting elements to convert the $(2^b-1)$-bit digital output code to an analog signal.

* * * * *

UNITED STATES PATENT AND TRADEMARK OFFICE
CERTIFICATE OF CORRECTION

| | | |
|---|---|---|
| PATENT NO. | : 8,159,381 B2 | Page 1 of 1 |
| APPLICATION NO. | : 12/842311 | |
| DATED | : April 17, 2012 | |
| INVENTOR(S) | : Rakhel Kumar Parida et al. | |

It is certified that error appears in the above-identified patent and that said Letters Patent is hereby corrected as shown below:

Title Page; (30) Foreign Application Priority Data should be --May 12, 2010 (IN) 1112/DEL/2010--

Signed and Sealed this
Third Day of July, 2012

David J. Kappos
*Director of the United States Patent and Trademark Office*